(12) United States Patent
Do et al.

(10) Patent No.: US 9,293,359 B2
(45) Date of Patent: Mar. 22, 2016

(54) NON-VOLATILE MEMORY CELLS WITH ENHANCED CHANNEL REGION EFFECTIVE WIDTH, AND METHOD OF MAKING SAME

(71) Applicant: Silicon Storage Technology, Inc., San Jose, CA (US)

(72) Inventors: Nhan Do, Saratoga, CA (US); Hieu Van Tran, San Jose, CA (US); Chien-Sheng Su, Saratoga, CA (US); Prateep Tuntasood, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/191,625

(22) Filed: Feb. 27, 2014

(65) Prior Publication Data
US 2014/0264539 A1    Sep. 18, 2014

Related U.S. Application Data

(60) Provisional application No. 61/784,556, filed on Mar. 14, 2013.

(51) Int. Cl.
*H01L 29/788* (2006.01)
*H01L 21/762* (2006.01)
*H01L 29/66* (2006.01)
*H01L 27/115* (2006.01)
*H01L 21/28* (2006.01)
*H01L 29/423* (2006.01)

(52) U.S. Cl.
CPC .... *H01L 21/76224* (2013.01); *H01L 21/28273* (2013.01); *H01L 27/11521* (2013.01); *H01L 29/42328* (2013.01); *H01L 29/42336* (2013.01); *H01L 29/66825* (2013.01); *H01L 29/788* (2013.01); *H01L 29/7881* (2013.01)

(58) Field of Classification Search
CPC ....................................... H01L 29/788
USPC .................. 257/316, 319; 438/266
See application file for complete search history.

(56) References Cited

U.S. PATENT DOCUMENTS

| | | | |
|---|---|---|---|
| 6,894,339 B2 * | 5/2005 | Fan et al. | 257/314 |
| 7,297,595 B2 | 11/2007 | Jung et al. | |
| 7,622,383 B2 | 11/2009 | Kim et al. | |
| 7,674,685 B2 | 3/2010 | Choi et al. | |

(Continued)

OTHER PUBLICATIONS

PCT Search Report dated May 14, 2014 corresponding to the related PCT Patent Application No. PCT/US2014/020015.

*Primary Examiner* — Jamie C Niesz
(74) *Attorney, Agent, or Firm* — DLA Piper LLP (US)

(57) ABSTRACT

A memory device array with spaced apart parallel isolation regions formed in a semiconductor substrate, with an active region between each pair of adjacent isolation regions. Each isolation region includes a trench formed into the substrate surface and an insulation material formed in the trench. Portions of a top surface of the insulation material are recessed below the surface of the substrate. Each active region includes a column of memory cells each having spaced apart first and second regions with a channel region therebetween, a floating gate over a first channel region portion, and a select gate over a second channel region portion. The select gates are formed as continuous word lines extending perpendicular to the isolation regions and each forming the select gates for one row of the memory cells. Portions of each word line extend down into the trenches and disposed laterally adjacent to sidewalls of the trenches.

7 Claims, 11 Drawing Sheets

(56) References Cited

U.S. PATENT DOCUMENTS

| | | |
|---|---|---|
| 7,927,994 B1 | 4/2011 | Liu et al. |
| 2004/0065917 A1* | 4/2004 | Fan et al. .................... 257/315 |
| 2005/0139900 A1 | 6/2005 | Jung et al. |
| 2007/0042573 A1 | 2/2007 | Kim et al. |
| 2008/0014711 A1 | 1/2008 | Choi et al. |
| 2010/0193857 A1* | 8/2010 | Nakagawa .................... 257/324 |

* cited by examiner

NON-VOLATILE MEMORY CELLS WITH ENHANCED CHANNEL REGION EFFECTIVE WIDTH, AND METHOD OF MAKING SAME

RELATED APPLICATIONS

This application claims the benefit of U.S. Provisional Application No. 61/784,556, filed Mar. 14, 2013, and which is incorporated herein by reference.

FIELD OF THE INVENTION

The present invention relates to non-volatile memory devices.

BACKGROUND OF THE INVENTION

Split gate non-volatile memory devices are well known in the art. For example, U.S. Pat. No. 7,927,994 discloses a split gate non-volatile memory cell, which is incorporated herein by reference for all purposes. FIG. 1 illustrates an example of such a split gate memory cell formed on a semiconductor substrate 12. Source and drain regions 16 and 14 are formed as diffusion regions in substrate 12, and define a channel region 18 therebetween. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14.

The memory cells are arranged in an array, with columns of such memory cells separated by columns of isolation regions. Isolation regions are portions of the substrate in which insulation material is formed. A well-known isolation region forming technique is STI, which involves forming trenches into the surface of the substrate, and filling the trenches with insulation material (e.g. silicon dioxide-oxide). The STI insulation material 28 has an upper surface that is typically even with or slightly higher than the surface of the substrate 12. FIG. 2 illustrates the conventional arrangement of the memory cells and the isolation regions 28. The select gates 20 for an entire row of memory cells are formed as a single conductive line (commonly referred to as a word line) that extends across the columns of STI insulation material 28. The control gates 26 are similarly formed as a continuous control gate line extending along the row of memory cells, as is the erase gate 24.

As device geometries continue to shrink, it is becoming more difficult to operate the memory cell array at lower voltages. For example, lowering the read voltage (e.g. positive voltage on the drain 14) results in a lower read cell current (in the channel region 18), and lowering the select gate voltage results in a higher sub-threshold leakage. Raising the select gate voltage to suppress leakage would result in suppressing the read cell current. There is a need to improve cell current during a read operation without compromising sub-threshold leakage.

BRIEF SUMMARY OF THE INVENTION

The aforementioned problems and needs are addressed by providing an array of memory devices that includes a substrate of semiconductor material having a first conductivity type and a surface, and spaced apart isolation regions formed in the substrate which are substantially parallel to one another and extend in a first direction, with an active region between each pair of adjacent isolation regions. Each of the isolation regions includes a trench formed into the surface of the substrate and an insulation material formed in the trench, wherein at least portions of a top surface of the insulation material are recessed below the surface of the substrate. Each of the active regions including a column of memory cells. Each of the memory cells includes spaced apart first and second regions formed in the substrate and having a second conductivity type different than the first conductivity type, wherein a channel region of the substrate is disposed between the first and second regions, a floating gate disposed over and insulated from a first portion of the channel region, and a select gate disposed over and insulated from a second portion of the channel region. The select gates are formed as continuous word lines each extending in a second direction perpendicular to the first direction and each forming the select gate for one of the memory cells in each of the columns of memory cells. Portions of each of the word lines extend down into the trenches and over the insulation material in the isolation regions such that for each memory cell the word line is disposed over and insulated from the top surface of the substrate and is disposed laterally adjacent to and insulated from sidewalls of the trenches.

A method of forming an array of memory devices includes providing a substrate of semiconductor material having a first conductivity type and a surface, and forming spaced apart isolation regions in the substrate which are substantially parallel to one another and extend in a first direction, with an active region between each pair of adjacent isolation regions. Each of the isolation regions are formed by, forming a trench into the surface of the substrate, and forming insulation material in the trench, wherein at least portions of a top surface of the insulation material are recessed below the surface of the substrate. The method further includes forming a column of memory cells in each of the active regions, where forming each memory cell includes forming spaced apart first and second regions in the substrate having a second conductivity type different than the first conductivity type, wherein a channel region of the substrate is disposed between the first and second regions, forming a floating gate over and insulated from a first portion of the channel region, and forming a select gate over and insulated from a second portion of the channel region. The select gates are formed as continuous word lines each extending in a second direction perpendicular to the first direction and each forming the select gate for one of the memory cells in each of the columns of memory cells. Portions of each of the word lines extend down into the trenches and over the insulation material in the isolation regions such that for each memory cell the word line is disposed over and insulated from the top surface of the substrate and is disposed laterally adjacent to and insulated from sidewalls of the trenches.

Other objects and features of the present invention will become apparent by a review of the specification, claims and appended figures.

DETAILED DESCRIPTION OF THE INVENTION

The present invention solves the above mentioned problems by increasing the effective width of the channel region under at least the select gate such that it is wider than the distance between adjacent isolation regions (which traditionally defines the width of the channel region). This modification improves cell current during a read operation without compromising sub-threshold leakage.

Figure 1:
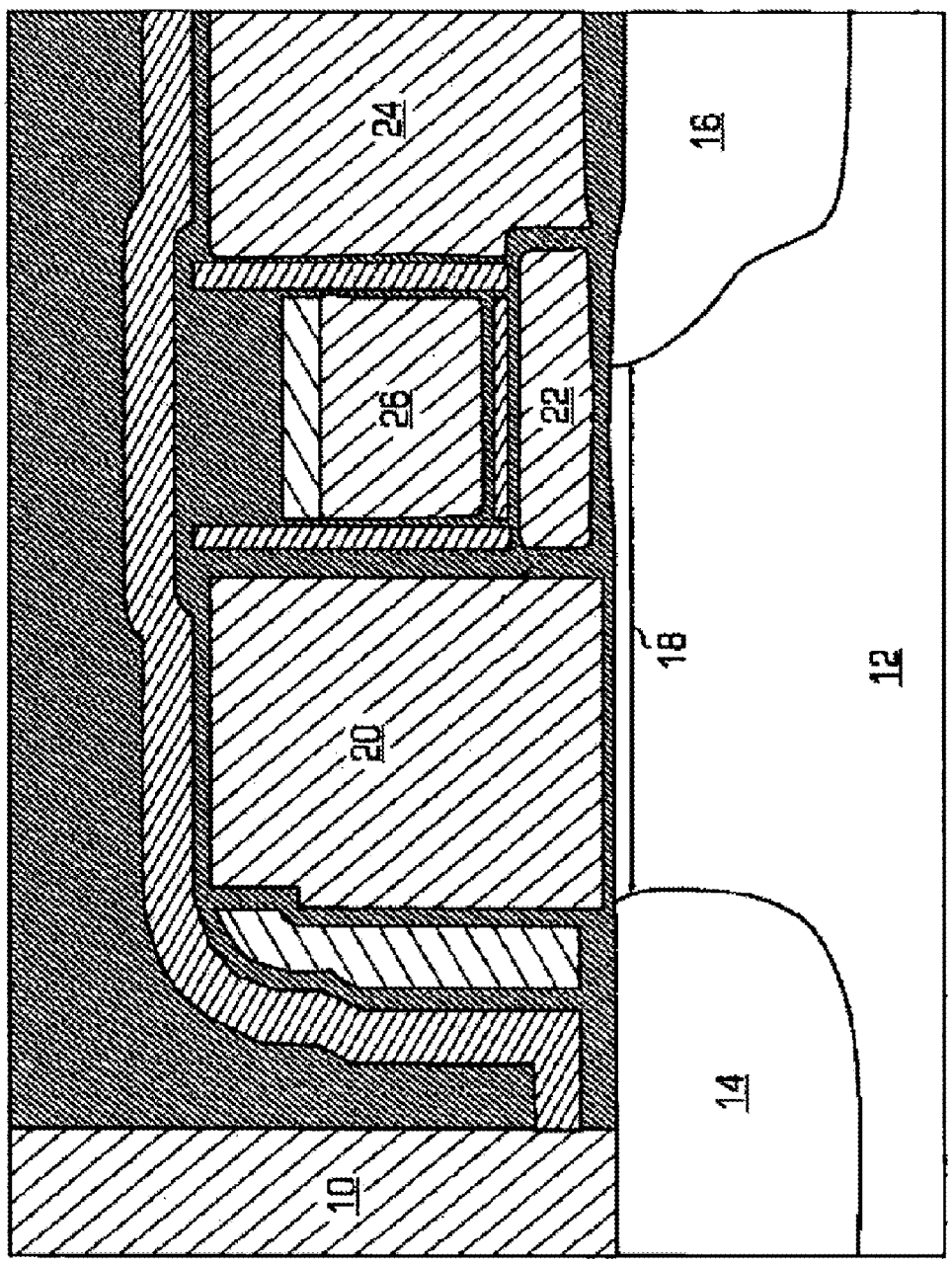
FIG. 1 is a side cross sectional view of a conventional memory cell.
Figure 2:
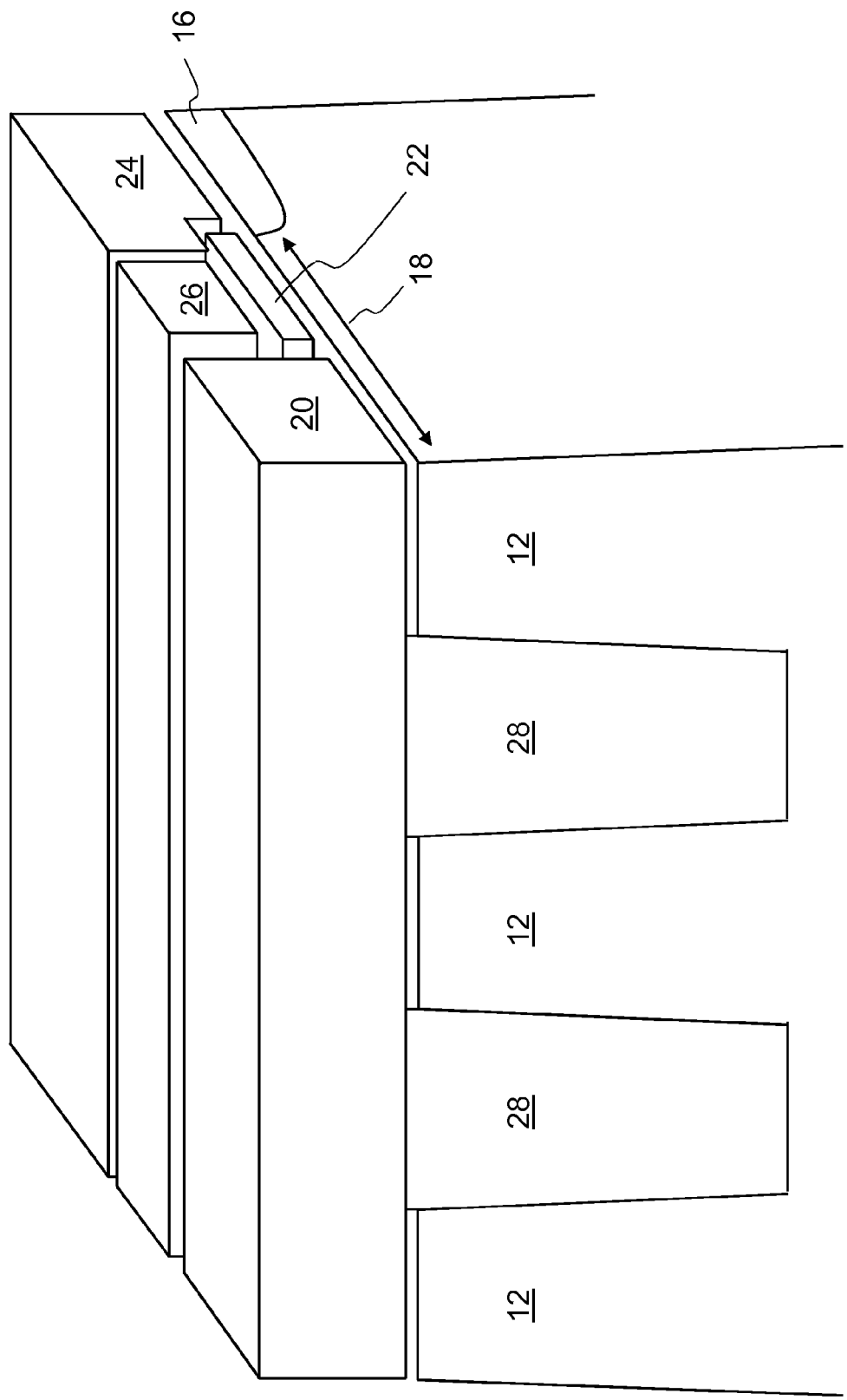
FIG. 2 is a perspective cross sectional view of a conventional memory cell array.
Figure 3:
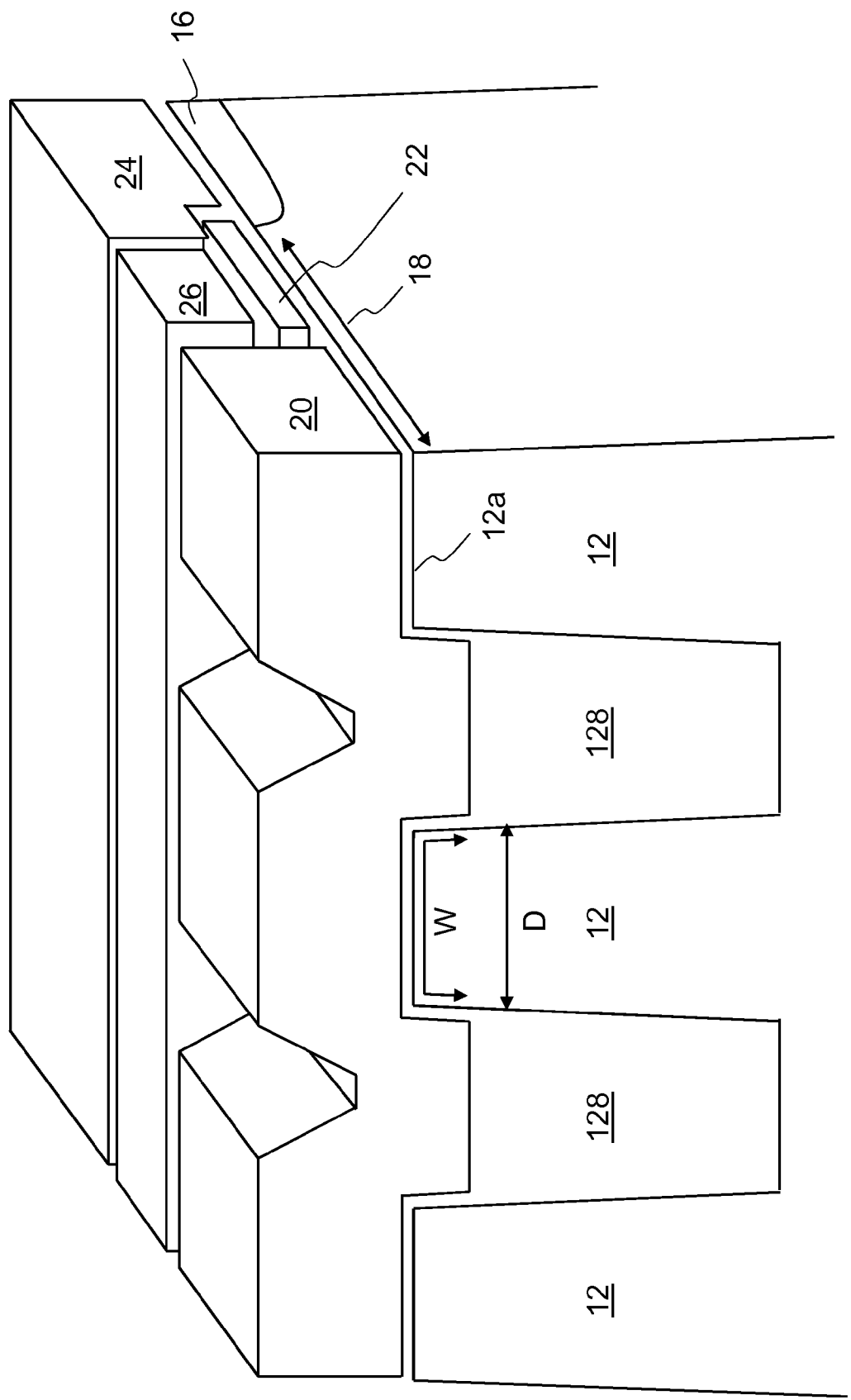
FIG. 3 is a perspective cross sectional view of the memory cell array of the present invention.

FIG. 3 illustrates the memory cell configuration with the enlarged effective channel region width, which is similar to the configuration shown in FIG. 2 (with like elements identified by the same reference numbers). The major difference is that for the portions of the isolation material 128 underneath the word line 120, the tops of isolation material 128 have been recessed below the top surface 12a of the substrate 12, and word line 120 extends down below the surface 12a of substrate 12 in the isolation regions. By doing so, word line 120 ends up wrapping around the substrate 12 between the isolation region columns 128. This configuration results in an effective channel region width W under each select gate 20 that is greater than the distance D between adjacent isolation regions. The greater effective channel region width W under each select gate 20 improves cell current during a read operation without compromising sub-threshold leakage.

The method of forming the memory cell configuration of FIG. 3 is illustrated in FIGS. 4A to 4F and 5A to 5L. The method begins with a semiconductor substrate 12, which is preferably of P type and is well known in the art.

Isolation Region Formation

Figure 4A:
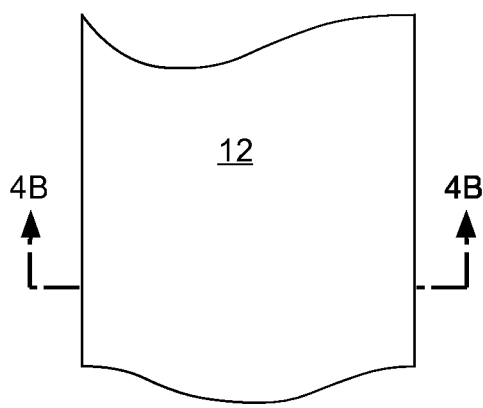
FIG. 4A is a top view of a semiconductor substrate used in the first step of the method of present invention to form isolation regions.
Figure 4B:
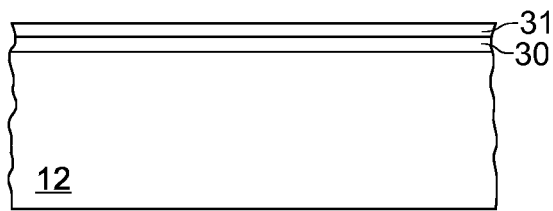
FIG. 4B is a cross sectional view of the structure taken along the line 4B-4B showing the initial processing steps of the present invention.

FIGS. 4A to 4F illustrate the well known STI method of forming isolation regions on a substrate. Referring to FIG. 4A there is shown a top plan view of a semiconductor substrate 12 (or a semiconductor well), which is preferably of P type and is well known in the art. First and second layers of material 30 and 31 are formed (e.g. grown or deposited) on the substrate. For example, first layer 30 can be silicon dioxide (hereinafter "oxide"), which is formed on the substrate 12 by any well known technique such as oxidation or oxide deposition (e.g. chemical vapor deposition or CVD). Nitrogen doped oxide or other insulation dielectrics can also be used. Second layer 31 can be silicon nitride (hereinafter "nitride"), which is formed over oxide layer 30 preferably by CVD or PECVD. FIG. 4B illustrates a cross-section of the resulting structure.

Figure 4D:
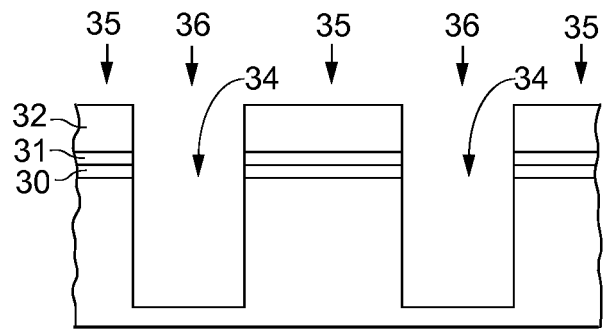
FIG. 4D is a cross sectional view of the structure in FIG. 4C taken along the line 4D-4D showing the isolation trenches formed in the structure.
Figure 4C:
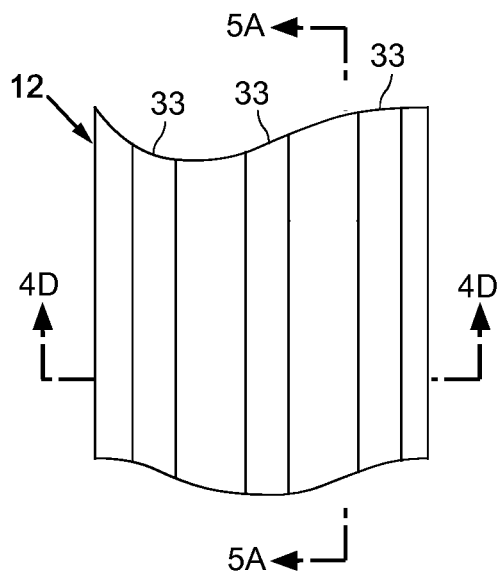
FIG. 4C is a top view of the structure showing the next step in the processing of the structure of FIG. 4B, in which isolation regions are defined.

Once the first and second layers 30/31 have been formed, suitable photo resist material 32 is applied on the nitride layer 31 and a masking step is performed to selectively remove the photo resist material from certain regions (stripes 33) that extend in the Y or column direction, as shown in FIG. 4C. Where the photo-resist material 32 is removed, the exposed nitride layer 31 and oxide layer 30 are etched away in stripes 33 using standard etching techniques (i.e. anisotropic nitride and oxide/dielectric etch processes) to form trenches 34 in the structure. A silicon etch process is then used to extend trenches 34 down into the silicon substrate 12, as shown in FIG. 4D. Where the photo resist 32 is not removed, the nitride layer 31 and oxide layer 30 are maintained. The resulting structure illustrated in FIG. 4D now defines active regions 35 interlaced with isolation regions 36.

Figure 4E:
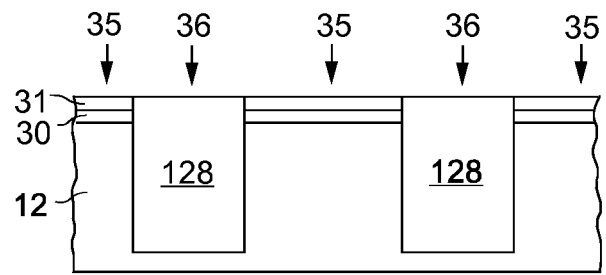
FIG. 4E is a cross sectional view of the structure in FIG. 4D showing the formation of isolation blocks of material in the isolation trenches.

The structure is further processed to remove the remaining photo resist 32. Then, an isolation material such as silicon dioxide is formed in trenches 34 by depositing a thick oxide layer, followed by a Chemical-Mechanical-Polishing or CMP etch (using nitride layer 31 as an etch stop) to remove the oxide layer except for oxide blocks 128 in trenches 34, as shown in FIG. 4E. The remaining nitride and oxide layers 31/30 are then removed using nitride/oxide etch processes, leaving STI oxide blocks 128 extending along isolation regions 36, as shown in FIG. 4F.

FIGS. 4A to 4F illustrate the memory cell array region of the substrate, in which columns of memory cells will be formed in the active regions 35 which are separated by the isolation regions 36. It should be noted that the substrate 12 also includes at least one periphery region in which control circuitry is formed that will be used to operate the memory cells formed in the memory cell array region. Preferably, isolation blocks 128 are also formed in the periphery region during the same STI process described above.

Memory Cell Formation

Figure 4F:
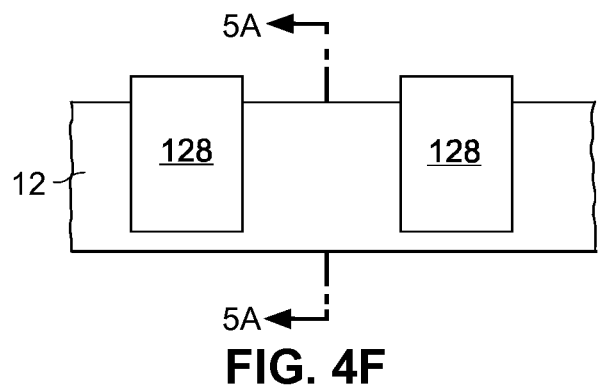
FIG. 4F is a cross sectional view of the structure in FIG. 4E showing the final structure of the isolation regions.

The structure shown in FIG. 4F is further processed as follows. FIGS. 5A to 5L show the cross sections of the structure in the active regions 35 from a view orthogonal to that of FIG. 4F (along line 5A-5A as shown in FIGS. 4C and 4F), as the next steps in the process of the present invention are performed. Commencing with FIG. 5A, there is shown the formation of a layer of silicon dioxide 40 on the substrate 12. Thereafter, a first layer 42 of polysilicon (or amorphous silicon) is deposited or formed on the layer 40 of silicon dioxide. The first layer 42 of polysilicon is subsequently patterned in a direction parallel to the active region 35 (to remove the polysilicon from the isolation regions 36).

Figure 5A:
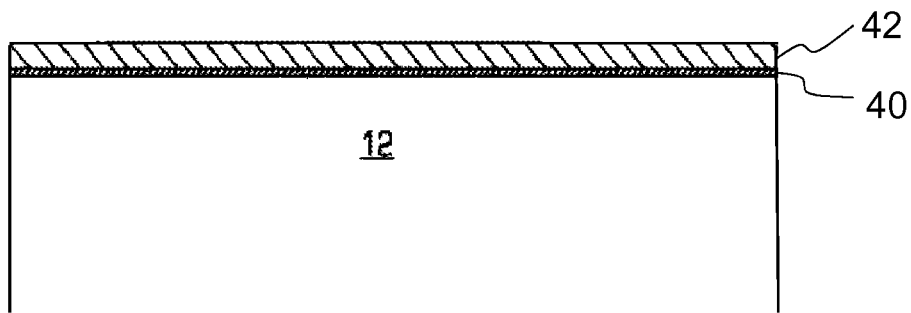
FIGS. 5A-5L are side cross sectional views of the semiconductor structure in FIG. 4F taken along the line 5A-5A showing in sequence the steps in the processing of the semiconductor structure in the formation of a non-volatile memory array of the present invention.
Figure 5B:
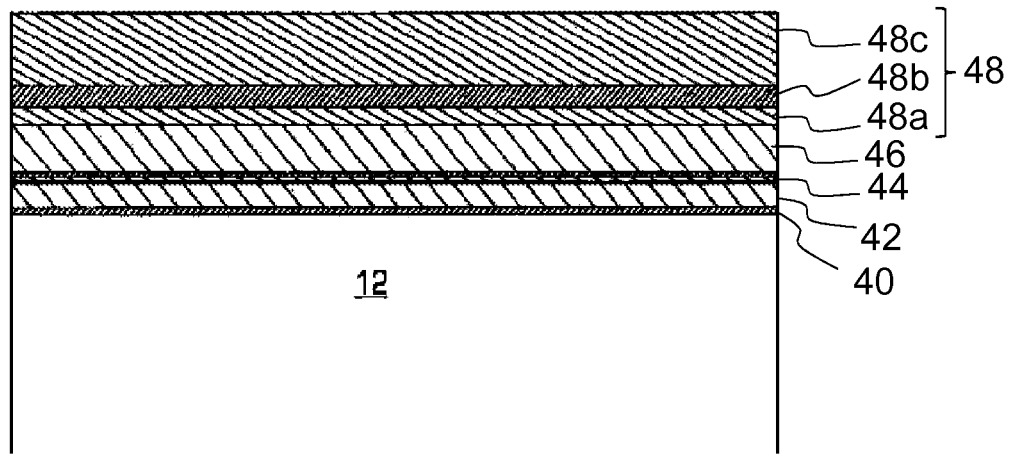

Referring to FIG. 5B, another insulating layer 44, such as silicon dioxide (or even a composite layer, such as ONO) is deposited or formed on the first layer 42 of polysilicon. A second layer 46 of polysilicon is then deposited or formed on the layer 44. Another layer 48 of insulator is deposited or formed on the second layer 46 of polysilicon and used as a hard mask during subsequent dry etching. In the preferred embodiment, the layer 48 is a composite layer, comprising silicon nitride 48a, silicon dioxide 48b, and silicon nitride 48c.

Figure 5C:
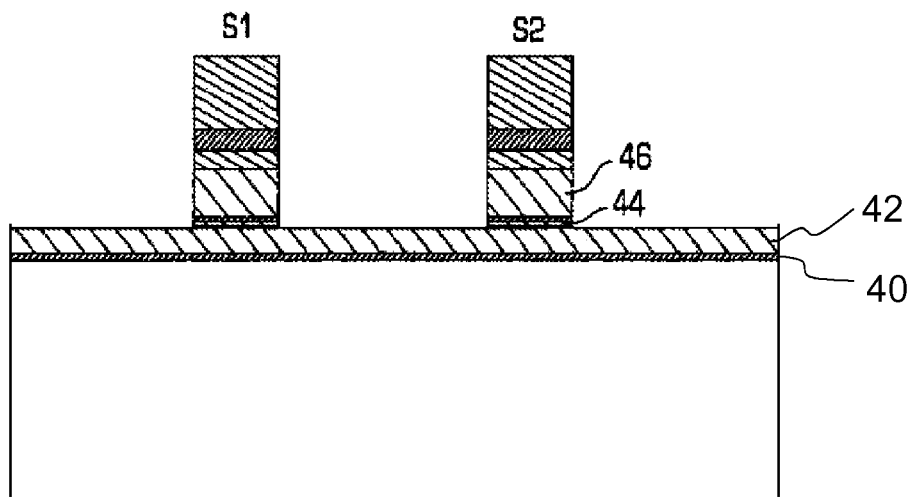

Referring to FIG. 5C, photoresist material (not shown) is deposited on the structure shown in FIG. 5B, and a masking step is formed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 5C. Although only two "stacks" S1 and S2 are shown, it should be clear that there are number of such "stacks" that are separated from one another.

Figure 5D:
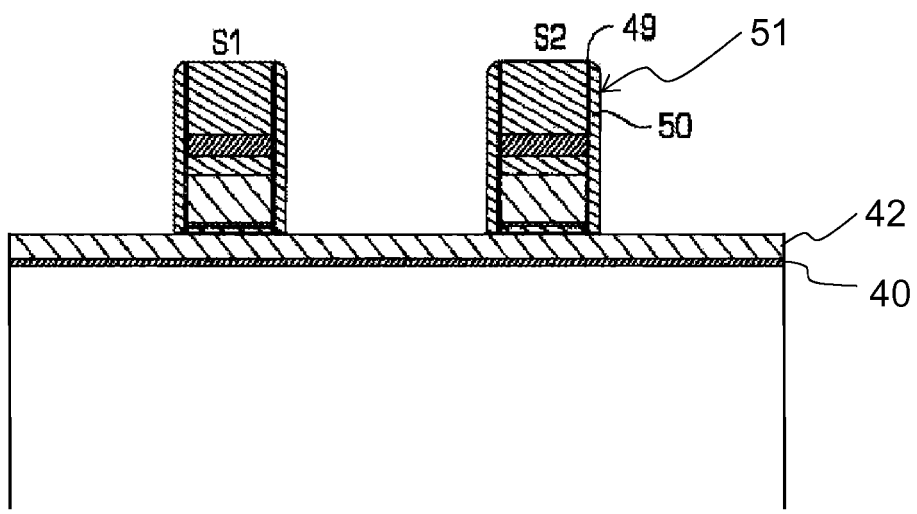

Referring to FIG. 5D, silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2. The resultant structure is shown in FIG. 5D.

Figure 5E:
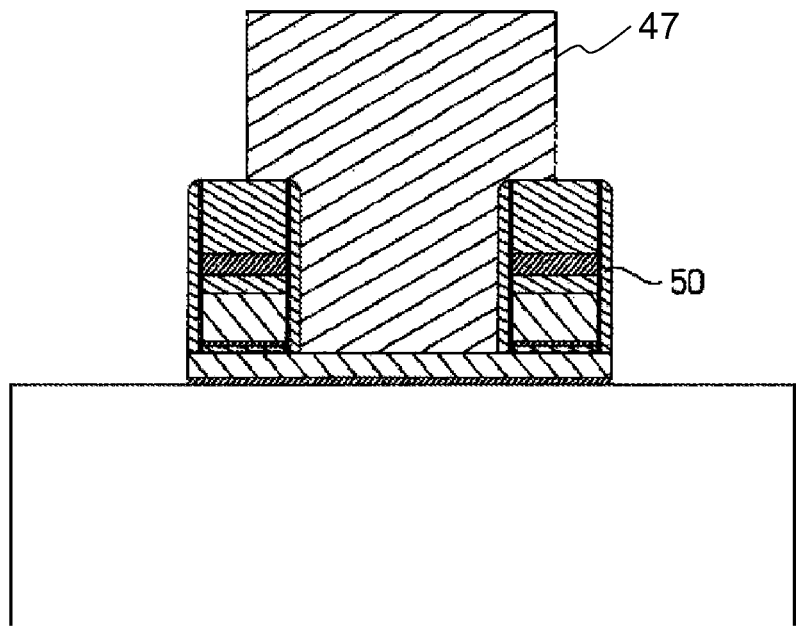

Referring to FIG. 5E, a photoresist mask 47 is formed over the regions between the stacks S1 and S2, and other alternating pairs stacks. For the purpose of this discussion, this region between the stacks S1 and S2 will be called the "inner region," and the regions not covered by the photoresist shall be referred to as the "outer regions." The exposed first polysilicon 42 in the outer regions is anisotropically etched. The oxide layer 40 is similarly anisotropically etched. The resultant structure is shown in FIG. 5E.

Figure 5F:
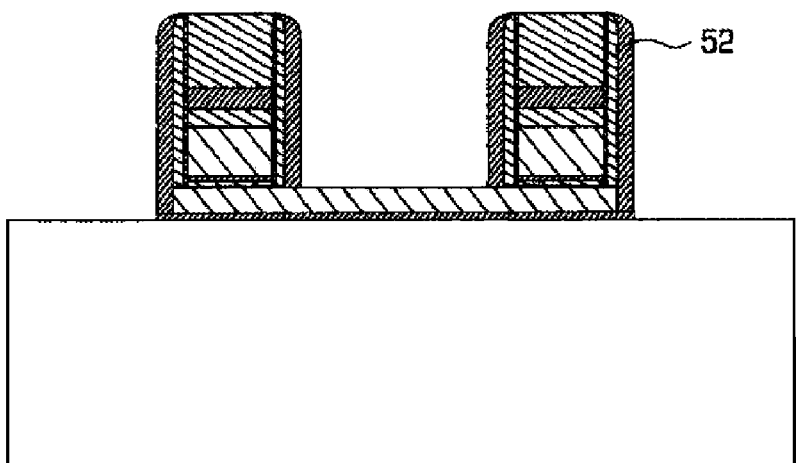

Referring to FIG. 5F, the photoresist material 47 is removed from the structure shown in FIG. 5E. A layer of oxide 52 is then deposited or formed. The oxide layer 52 is then subject to an anisotropic etch leaving spacers 52, adjacent to the stacks S1 and S2. The resultant structure is shown in FIG. 5F.

Figure 5G:
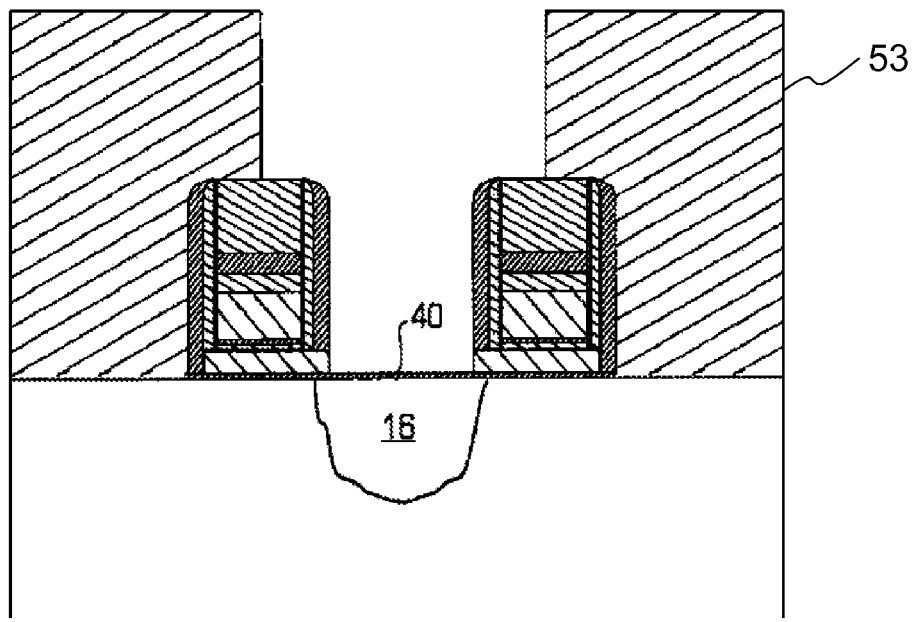

Referring to FIG. 5G, photoresist material 53 is then deposited and is masked leaving openings in the inner regions between the stacks S1 and S2. Again, similar to the drawing shown in FIG. 5E, the photoresist is between other alternating pairs of stacks. The polysilicon 42 in the inner regions between the stacks S1 and S2 (and other alternating pairs of stacks) is anisotropically etched. The silicon dioxide layer 40 beneath the polysilicon 42 may also be anisotropically etched. The resultant structure is subject to a high voltage ion implant forming the second regions 16. The resultant structure is shown in FIG. 5G.

Figure 5H:
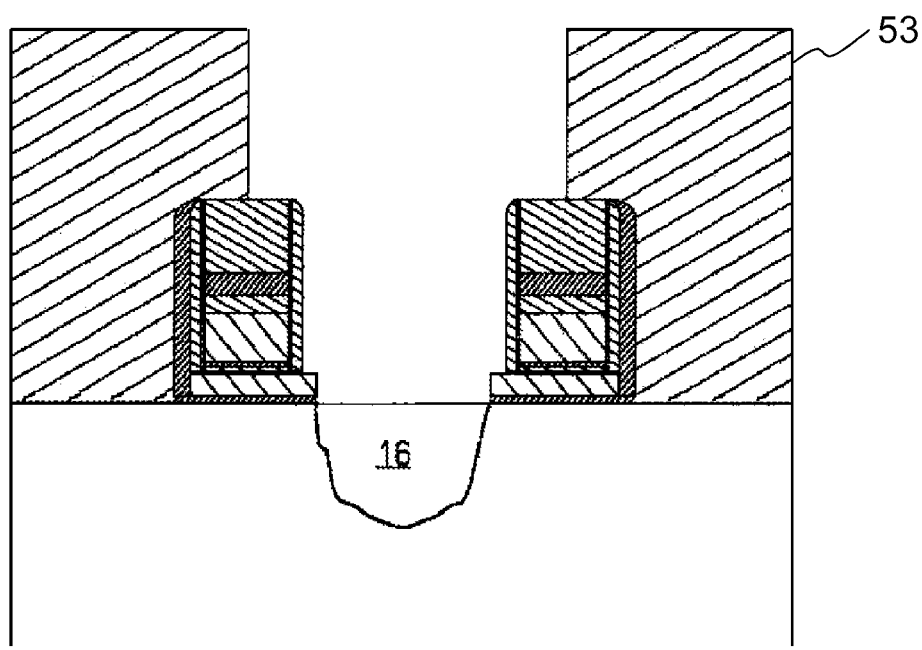
Figure 5I:
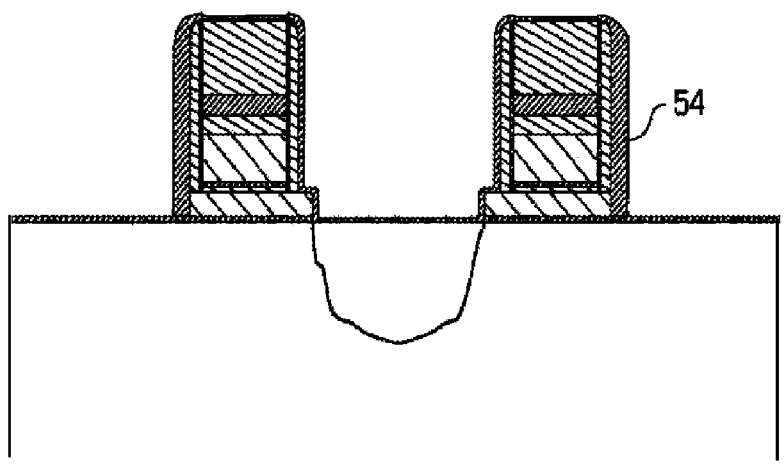

Referring to FIG. 5H, the oxide spacer 52 adjacent to the stacks S1 and S2 in the inner region is removed by e.g. a wet etch or a dry isotropic etch. Referring to FIG. 5I, the photoresist material 53 in the outer regions of the stacks S1 and S2 is removed. Silicon dioxide 54 is deposited or formed everywhere. The resultant structure is shown in FIG. 5I.

Figure 5J:
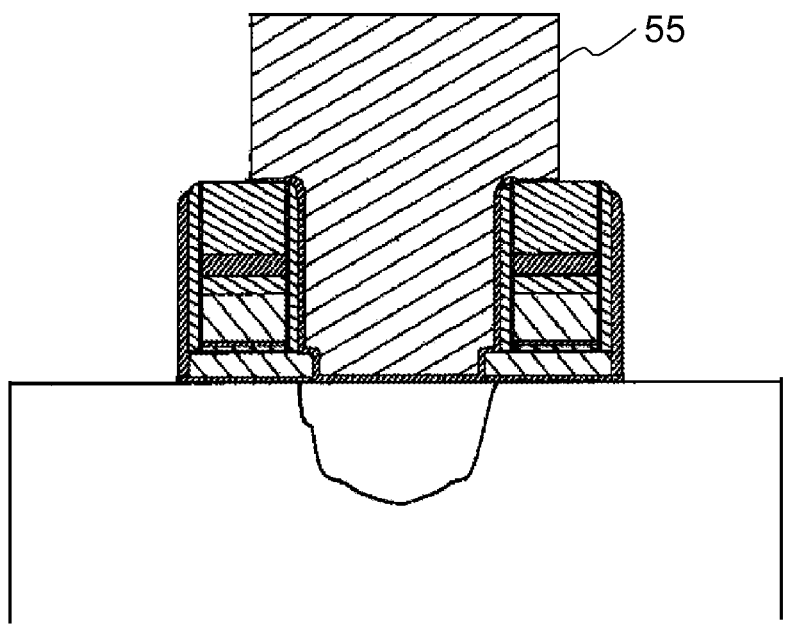

Referring to FIG. 5J, the structure is once again covered by photoresist material and a masking step is performed exposing the outer regions of the stacks S1 and S2 and leaving photoresist material 55 covering the inner region between the stacks S1 and S2. An oxide anisotropic etch is performed, to reduce the thickness of the spacer 54 in the outer regions of the stack S1 and S2, and to completely remove silicon dioxide from the exposed silicon substrate 12 in the outer regions. The resultant structure is shown in FIG. 5J.

Figure 5K:
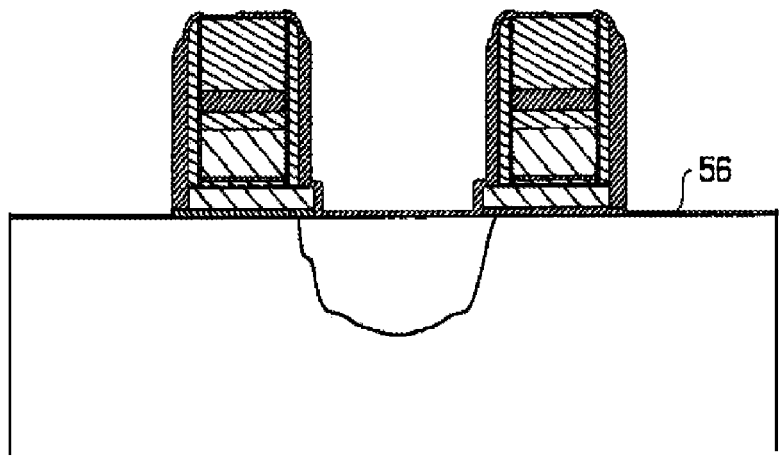

The photoresist material 55 is removed, and new photoresist material is deposited followed by a masking step so that strips of the photoresist extending across the active and isolation regions 35/36 cover the stacks S1 and S2 and the inner regions, but the outer regions of the stacks S1 and S2 and the corresponding portions of the isolation regions are exposed. An anisotropic oxide etch is then performed to recess the tops of STI oxide blocks 128 in the isolation regions 36 so that they are below the surface of the substrate 12. A thin layer 56 of silicon dioxide is formed on the structure. This oxide layer 56 is the gate oxide between the select gate and the substrate 12. The resultant active region structure is shown in FIG. 5K.

Figure 5L:
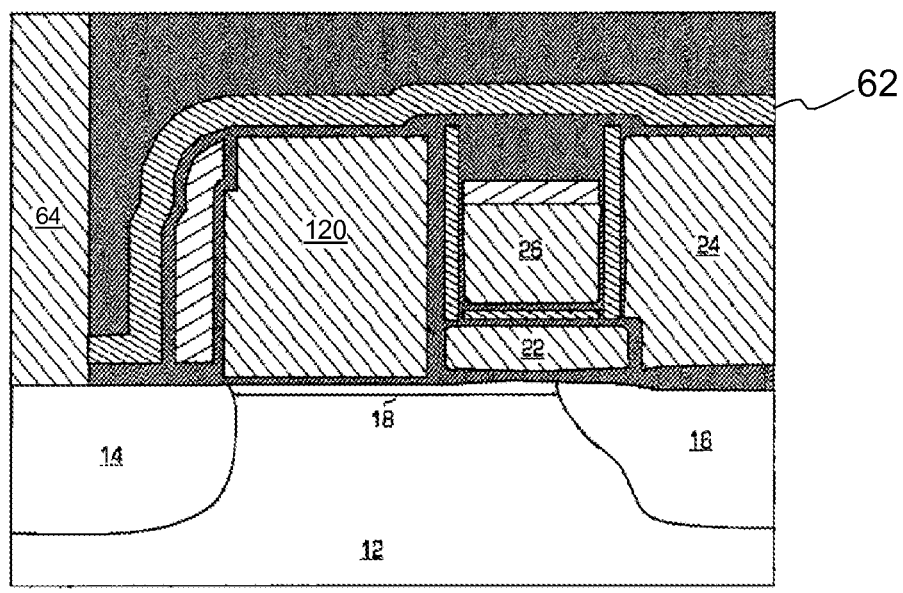

Referring to FIG. 5L, polysilicon is deposited everywhere. The layer of polysilicon is then subject to a poly etch (e.g. CMP). A masking step is used to cover the structure with photoresist except for portions of the poly layer in the outer regions of the stack S1 and S2. A poly etch follows, resulting in forming blocks 120 of the polysilicon in the outer regions of the stack S1 and S2 (which form the select gates 120 of two memory cells adjacent to one another sharing a common second region 16). Blocks 120 are formed as continuous word lines that extend across an entire row of memory cells. The word lines 120 extend over oxide layer 56 in the active regions 35, and extend down into trenches 34 and over oxide 128 in the trenches 34 of the isolation regions 36. In addition, blocks 24 of the polysilicon within the inner regions of the stacks S1 and S2 form a single erase gate 24 which is shared by the two adjacent memory cells. A layer of insulator 62 is deposited on the structure. In the preferred embodiment, insulator 62 is a composite layer comprising silicon dioxide and silicon nitride. Thereafter, an ion implant step is performed forming the first regions 14. Each of these memory cells on another side share a common first region 14. Insulators and metallization layers are subsequently deposited and patterned to form bit line contacts 64. The resulting structure is shown in FIG. 5L.

Figure 6:
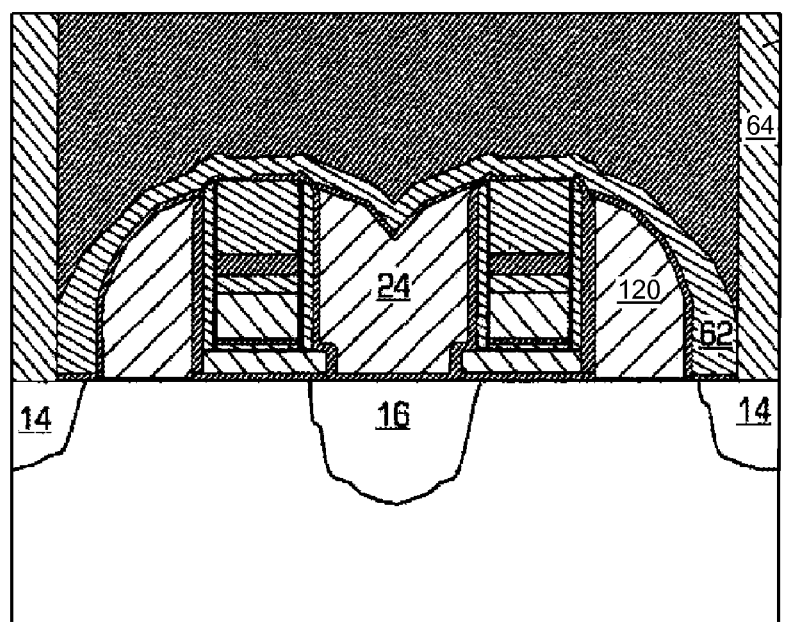
FIG. 6 is a side cross sectional view showing an alternate embodiment for the formation of the select and erase gates.

Alternately, select and erase gates 120/24 can be formed as poly spacers. Specifically, starting with the structure of FIG. 5K, polysilicon is deposited everywhere. The layer of polysilicon is then subject to an anisotropic etch forming spacers in the outer regions of the stack S1 and S2 which form the select gates 120 of two memory cells adjacent to one another sharing a common second region 16. These spacers are formed as continuous word lines that extend across an entire row of memory cells as described above (i.e. they extend over oxide layer 56 in the active regions 35, and they extend down into trenches 34 and over oxide 128 in the trenches 34 of the isolation regions 36). In addition, the spacers within the inner regions of the stacks S1 and S2 are merged together forming a single erase gate 24 which is shared by the two adjacent memory cells. The layer of insulator 62 is deposited on the structure, followed by the ion implant step to form the first regions 14, and followed by the insulators and metallization layers deposited and patterned to form bit line contacts 64. The resulting structure is shown in FIG. 6

The memory cell configuration described above provides an effective width of the channel region under at least the select gate 20 that is wider than the distance between adjacent isolation regions 36, which results in improved cell current during a read operation without compromising sub-threshold leakage. This is accomplished by having the word line 20 disposed over and insulated from the top surface of the substrate, and disposed laterally adjacent to and insulated from the sidewalls of trenches 34, for controlling the conductivity of these portions of the substrate 12.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cells of the present invention. Single layers of material could be formed as multiple layers of such or similar materials, and vice versa. The terms "forming" and "formed" as used herein shall include material deposition, material growth, or any other technique in providing the material as disclosed or claimed. Lastly, while the present invention is disclosed in the context of a four gate memory cell (floating gate, select gate, erase gate and control gate), it is also applicable to memory cells having greater or fewer numbers of gates). For example, the memory cell could be a split gate memory cell with just a select gate and a floating gate.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An array of memory devices, comprising:
    a substrate of semiconductor material having a first conductivity type and a top surface;
    spaced apart isolation regions formed in the substrate which are substantially parallel to one another and extend in a first direction, with an active region between each pair of adjacent isolation regions;
    each of the isolation regions includes a trench formed into and extending below the top surface of the substrate and an insulation material formed in the trench, wherein at least portions of a top surface of the insulation material are recessed below the top surface of the substrate;
    each of the active regions including a column of memory cells, wherein each of the memory cells comprises:
        spaced apart first and second regions formed along the top surface of the substrate and having a second conductivity type different than the first conductivity type, wherein a channel region of the substrate is disposed between the first and second regions,
        a floating gate disposed over and insulated from a first portion of the channel region, and
        a select gate disposed over and insulated from a second portion of the channel region;
    wherein the select gates are formed as continuous word lines each extending in a second direction perpendicular to the first direction and each forming the select gate for one of the memory cells in each of the columns of memory cells, and wherein portions of each of the word lines extend down into the trenches and over the insulation material in the isolation regions such that for each memory cell:
        a first portion of the word line is disposed over and insulated from the top surface of the substrate,
        a second portion of the word line is disposed laterally adjacent to and insulated from a first sidewall of one of the trenches extending down from the top surface of the substrate,
        a third portion of the word line is disposed laterally adjacent to and insulated from a second sidewall of another one of the trenches extending down from the top surface of the substrate,
        such that the top surface of the substrate and the first and second sidewalls form the channel region; and
    wherein each of the floating gates is conductive material disposed over and insulated from the top surface of the substrate without any portion thereof extending into any of the trenches.

2. The array of memory devices of claim 1, wherein each of the memory cells further comprises:
    a control gate disposed over and insulated from the floating gate; and
    an erase gate disposed over and insulated from the first region.

3. The array of memory devices of claim 2, wherein for each of the memory cells, a portion of the floating gate is disposed over and insulated from the first region.

4. A method of forming an array of memory devices, comprising:
    providing a substrate of semiconductor material having a first conductivity type and a top surface;
    forming spaced apart isolation regions in the substrate which are substantially parallel to one another and extend in a first direction, with an active region between each pair of adjacent isolation regions, wherein each of the isolation regions are formed by:
        forming a trench into and extending below the top surface of the substrate, and
        forming insulation material in the trench, wherein at least portions of a top surface of the insulation material are recessed below the top surface of the substrate;
    forming a column of memory cells in each of the active regions, wherein forming each memory cell comprises:
        forming spaced apart first and second regions along the top surface of the substrate having a second conductivity type different than the first conductivity type, wherein a channel region of the substrate is disposed between the first and second regions,
        forming a floating gate over and insulated from a first portion of the channel region, and
        forming a select gate over and insulated from a second portion of the channel region;
    wherein the select gates are formed as continuous word lines each extending in a second direction perpendicular to the first direction and each forming the select gate for one of the memory cells in each of the columns of memory cells, and wherein portions of each of the word lines extend down into the trenches and over the insulation material in the isolation regions such that for each memory cell:
        a first portion of the word line is disposed over and insulated from the top surface of the substrate,
        a second portion of the word line is disposed laterally adjacent to and insulated from a first sidewall of one of the trenches extending down from the top surface of the substrate,
        a third portion of the word line is disposed laterally adjacent to and insulated from a second sidewall of another one of the trenches extending down from the top surface of the substrate,
        such that the top surface of the substrate and the first and second sidewalls form the channel region; and
    wherein each of the floating gates is conductive material disposed over and insulated from the top surface of the substrate without any portion thereof extending into any of the trenches.

5. The method of claim 4, wherein forming each of the memory cells further comprises:
    forming a control gate over and insulated from the floating gate; and forming an erase gate over and insulated from the first region.

6. The method of claim 5, wherein for each of the memory cells, a portion of the floating gate is disposed over and insulated from the first region.

7. The method of claim 4, wherein the forming of each of the isolation regions comprises:
   forming the trench into the top surface of the substrate;
   forming the insulation material in the trench; and
   removing top portions of the insulation material in the trench such that the at least portions of the top surface of the insulation material is recessed below the top surface of the substrate.

\* \* \* \* \*